(12) United States Patent
Miwa et al.

(10) Patent No.: US 9,214,903 B2
(45) Date of Patent: Dec. 15, 2015

(54) AMPLIFIER

(71) Applicant: Mitsubishi Electric Corporation, Tokyo (JP)

(72) Inventors: Shinichi Miwa, Tokyo (JP); Kunihiro Sato, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 35 days.

(21) Appl. No.: 14/321,859

(22) Filed: Jul. 2, 2014

(65) Prior Publication Data

US 2015/0116040 A1    Apr. 30, 2015

(30) Foreign Application Priority Data

Oct. 31, 2013   (JP) .................... 2013-226714

(51) Int. Cl.
| | | |
|---|---|---|
| H03F 3/14 | (2006.01) | |
| H03F 3/195 | (2006.01) | |
| H03F 1/56 | (2006.01) | |
| H03F 3/60 | (2006.01) | |

(52) U.S. Cl.
CPC ............. H03F 3/195 (2013.01); H03F 1/56 (2013.01); H03F 3/604 (2013.01); *H01L 2224/48091* (2013.01); *H01L 2224/48137* (2013.01); *H01L 2224/48464* (2013.01); *H01L 2224/49175* (2013.01); *H01L 2224/73265* (2013.01); *H01L 2924/19107* (2013.01); *H01L 2924/3011* (2013.01); *H01L 2924/30111* (2013.01); *H03F 2200/267* (2013.01); *H03F 2200/75* (2013.01)

(58) Field of Classification Search
USPC ................................. 330/307, 302
IPC ........................................ H03F 3/14
See application file for complete search history.

(56) References Cited

U.S. PATENT DOCUMENTS

| | | | | | |
|---|---|---|---|---|---|
| 5,752,182 | A | * | 5/1998 | Nakatsuka | H01L 23/645 257/E28.029 |
| 6,163,221 | A | * | 12/2000 | Matsuno | H03F 3/601 330/302 |
| 2005/0098851 | A1 | * | 5/2005 | Nakayama | H01L 27/0805 257/528 |
| 2005/0213267 | A1 | * | 9/2005 | Azrai | H02M 3/07 361/15 |
| 2008/0149981 | A1 | * | 6/2008 | Lamey | H01L 23/642 257/306 |
| 2010/0237967 | A1 | * | 9/2010 | Ueno | H01L 21/312 333/246 |
| 2012/0326780 | A1 | * | 12/2012 | Balm | H01P 5/185 330/124 R |
| 2013/0106503 | A1 | * | 5/2013 | Kajii | H01L 23/66 327/552 |

FOREIGN PATENT DOCUMENTS

| | | |
|---|---|---|
| JP | 6-318805 A | 11/1994 |
| JP | 10-256850 A | 9/1998 |
| JP | 2001-257313 A | 9/2001 |

* cited by examiner

*Primary Examiner* — Patricia T Nguyen
(74) *Attorney, Agent, or Firm* — Leydig, Voit & Mayer, Ltd.

(57) ABSTRACT

An amplifier includes a transistor chip, a matching chip with a capacitor group having multiple MIM capacitors, each of the MIM capacitors including a lower electrode, a dielectric, and an upper electrode, a bonding wire that electrically connects the transistor chip to the upper electrode of any one of the MIM capacitors of the capacitor group and transmits a high-frequency signal, and a case that accommodates the transistor chip and the matching chip. The lower electrodes of the MIM capacitors are grounded, and capacitance values of each of the MIM capacitors of the capacitor group are different from each other.

5 Claims, 5 Drawing Sheets

AMPLIFIER

BACKGROUND OF THE INVENTION

1. Field of the Invention

The present invention relates to an amplifier to be mounted in for example, a communications satellite, a radar, or a base station.

2. Background Art

A high-output amplifier with an output of tens of watts or more includes for example, an internally matching type amplifier and a partially matching type amplifier. These amplifiers are not severely demanded to be downsized in comparison to an amplifier for a cell phone. Therefore, in many cases, a distributed constant circuit such as a microstrip line is used for impedance matching, so that power losses are suppressed and the amplifier becomes favorable for wider bandwidth. Unexamined Japanese Patent Application Publication No. H6-318805 discloses an amplifier that transmits a high-frequency signal to a microstrip line.

For example, in a case where the operation frequency is relatively low such as in an L band and an S band, the wavelength of the high-frequency signal is extended. Thus, the line length of the microstrip line required for impedance matching is extended. Therefore, the size of the amplifier is increased.

When the size increase of the amplifier is avoided, patterns for changing the operation frequency cannot be provided and the amplifier cannot correspond to wider bandwidth. In this case, in order to obtain a favorable high-frequency characteristic, a new design of a matching circuit is required for every time the operation frequency is changed by about 100 MHz for example. Thus, there is a problem that the matching circuit is less versatile.

SUMMARY OF THE INVENTION

The present invention is achieved in order to solve the above problem, and an object thereof is to provide a highly versatile amplifier having a matching circuit capable of corresponding to wider operation frequencies.

The features and advantages of the present invention may be summarized as follows.

According to one aspect of the present invention, an amplifier includes a transistor chip, a matching chip with a capacitor group having a plurality of MIM capacitors, each of the MIM capacitors being formed of a lower electrode, a dielectric, and an upper electrode, a bonding wire that connects the transistor chip and the upper electrode of any one of the MIM capacitors of the capacitor group and transmits a high-frequency signal, and a case that accommodates the transistor chip and the matching chip, wherein the lower electrodes of the plurality of MIM capacitors are grounded, and capacitance values of the MIM capacitors of the capacitor group are different from each other.

Other and further objects, features and advantages of the invention will appear more fully from the following description.

DETAILED DESCRIPTION OF THE PREFERRED EMBODIMENTS

Amplifiers according to embodiments of the present invention will be described with reference to the drawings. The same or corresponding constituent elements will be given the same reference signs, and the repetitive description may be omitted.

Embodiment 1

Figure 1:
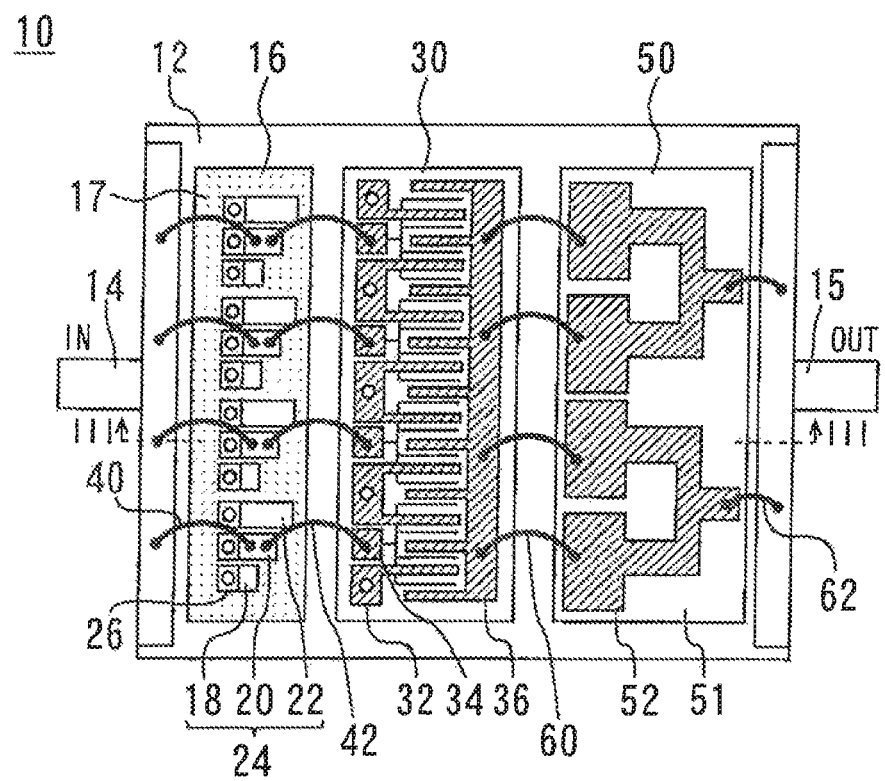
FIG. 1 is a plan view of an amplifier according to Embodiment 1 of the present invention.

FIG. 1 is a plan view of an amplifier 10 according to Embodiment 1 of the present invention. The amplifier 10 includes a case 12. An input feed-through unit 14 is attached on the left side of the case 12, and an output feed-through unit 15 is attached on the right side of the case. A high-frequency package is formed of the case 12, the input feed-through unit 14, and the output feed-through unit 15.

A matching chip 16 for impedance matching is accommodated in the case 12. The matching chip 16 includes a substrate 17. The substrate 17 is formed of a compound semiconductor of GaAs or the like for high integration. The matching chip 16 includes MIM (Metal-Insulator-Metal) capacitors 18, 20, 22 formed on the substrate 17. The MIM capacitors 18, 20, 22 are arranged in an array row. The MIM capacitors 18, 20, 22 are collectively called as a capacitor group 24. Four capacitor groups 24 are formed and any of the capacitor groups has the same configuration.

Figure 2:
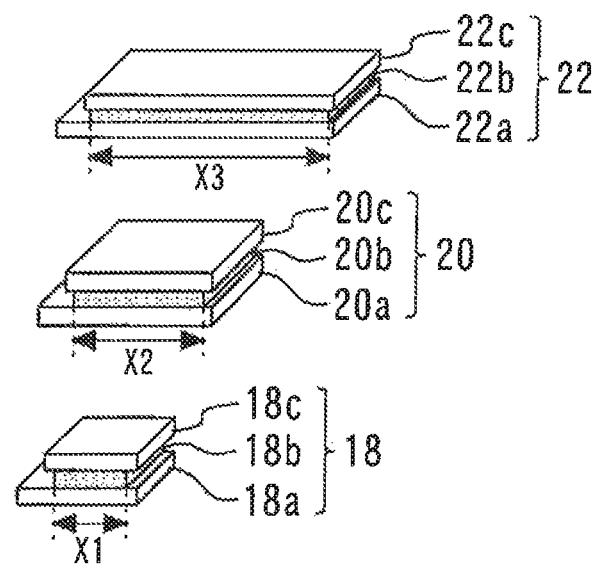
FIG. 2 is a perspective view of the capacitor group.

FIG. 2 is a perspective view of the capacitor group 24. The MIM capacitor 18 is formed of a lower electrode 18a, a dielectric 18b, and an upper electrode 18c. The MIM capacitor 20 is formed of a lower electrode 20a, a dielectric 20b, and an upper electrode 20c. The MIM capacitor 22 is formed of a lower electrode 22a, a dielectric 22b, and an upper electrode 22c.

Thicknesses of the dielectrics 18b, 20b, 22b are uniform. That is, all the thicknesses of the dielectrics 18b, 20b, 22b are the same. However, since a length X1 of the dielectric 18b is shorter than a length X2 of the dielectric 20b and the length X2 of the dielectric 20b is shorter than a length X3 of the dielectric 22b, electric capacitance values (hereinafter, the electric capacitance values will be called as the capacitance values) of the MIM capacitors 18, 20, 22 of the capacitor group 24 are not uniform. That is, the capacitance values of the MIM capacitors 18, 20, 22 are different from each other. Since the length X1, the length X2, and the length X3 are different from each other, areas of the dielectrics 18b, 20b, 22b are different from each other, so that the capacitance values of the MIM capacitors 18, 20, 22 are different from each other.

Returning to the description of FIG. 1, the lower electrodes of the MIM capacitors 18, 20, 22 described above are in contact with through electrodes 26. The through electrodes 26 are formed along wall surfaces of through holes of the substrate 17 and electrically connect the lower electrodes and the case 12. Therefore, the lower electrodes of the MIM capacitors 18, 20, 22 are grounded by the through electrodes 26.

A transistor chip 30 is provided next to the matching chip 16. A multi-cell transistor is formed in the transistor chip 30. This multi-cell transistor includes a plurality of source electrodes 32, a plurality of gate electrodes 34, and a drain electrode 36. It should be noted that the multi-cell transistor is for example a HEMT (High Electron Mobility Transistor) made of GaN.

The input feed-through unit 14 and the upper electrode of the MIM capacitor 20 are connected by a bonding wire 40. The transistor chip 30 (gate electrode 34) and the upper electrode of the MIM capacitor 20 are connected by a bonding wire 42. The capacitor group 24 described above and the bonding wires 40, 42 are provided for each of cells of the multi-cell transistor. That is, the capacitor group 24 and the bonding wires 40, 42 are provided for each of four cells of the multi-cell transistor. The high-frequency signal is transmitted through the bonding wires 40, 42.

A matching chip 50 is provided next to the transistor chip 30. The matching chip 50 includes a ceramic substrate 51, and microstrip lines 52 formed on the ceramic substrate 51.

The transistor chip 30 (drain electrode 36) and the microstrip line 52 are connected by a bonding wire 60. The microstrip line 52 and the output feed-through unit 15 are connected by a bonding wire 62.

Figure 3:
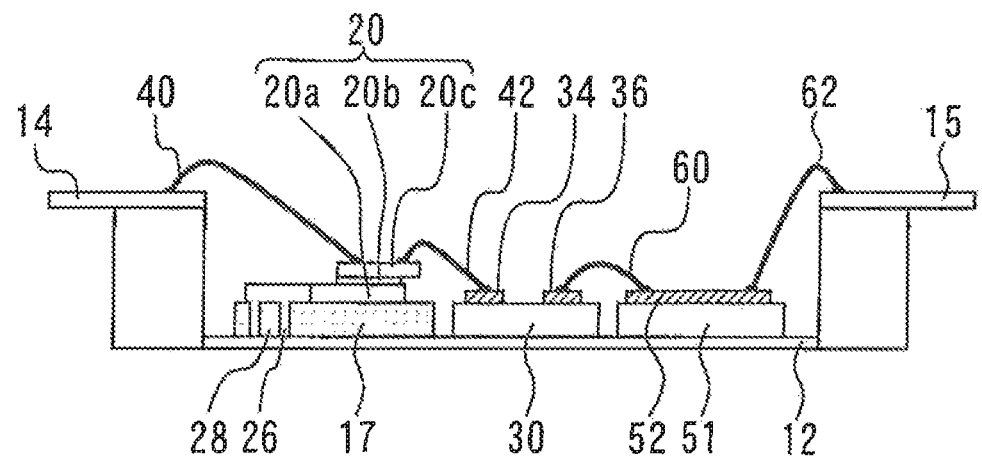
FIG. 3 is an arrow sectional view taken along a broken line III-III of FIG. 1.

FIG. 3 is an arrow sectional view taken along a broken line III-III of FIG. 1. The lower electrode 20a is in contact with the through electrode 26 formed along a through hole 28 of the substrate 17. Therefore, the lower electrode 20a is grounded. The other lower electrodes are grounded by the same method. In such a way, the MIM capacitor 20 is shunt-connected to a transmission line of the high-frequency signal inputted from the input feed-through unit 14.

Figure 4:
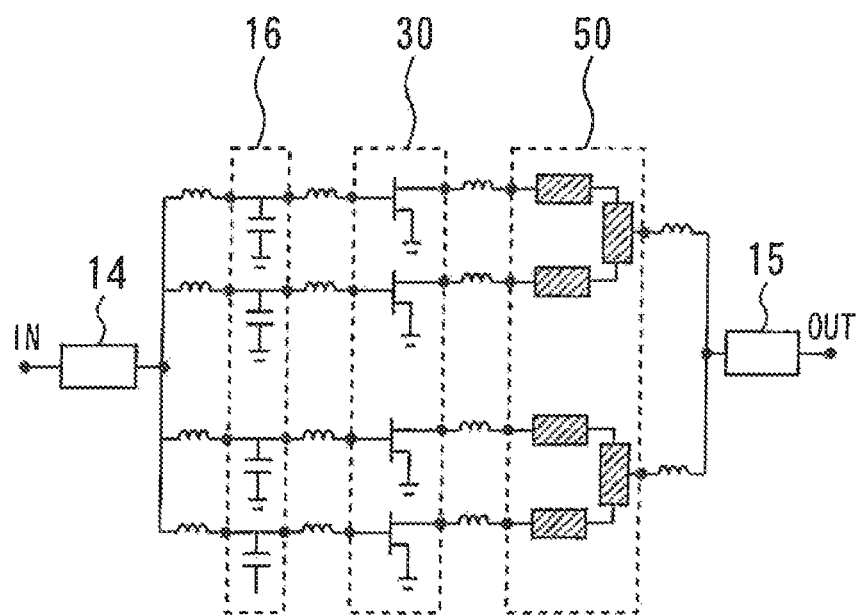
FIG. 4 is a circuit diagram of the amplifier of FIG. 1.

FIG. 4 is a circuit diagram of the amplifier 10 of FIG. 1. Since the matching chip 16 is provided, shunt capacitance is connected to the transmission line. Therefore, in the amplifier 10, impedance matching is performed with L (inductance) provided in series in the transmission line and C (capacitance) provided in a shunt form in the transmission line in order to suppress waveform degradation of the high-frequency signal.

As described with reference to FIGS. 1 to 4, the amplifier 10 is an internally matching type amplifier or a partially matching type amplifier in which the transistor chip 30, the matching chip 16 arranged on the input side of the transistor chip 30, and the matching chip 50 arranged on the output side of the transistor chip 30 are accommodated in the case 12.

In the amplifier 10 according to Embodiment 1 of the present invention, the capacitance values of the MIM capacitors 18, 20, 22 of the capacitor group 24 are non-uniform values. Thus, by choosing connection destinations of the bonding wires 40, 42 from the MIM capacitors 18, 20, 22, three cases of impedance can be realized. That is, impedance can be changed between a case where the bonding wires 40, 42 are connected to the upper electrode of the MIM capacitor 18, a case where the bonding wires are connected to the upper electrode of the MIM capacitor 20, and a case where the bonding wires are connected to the upper electrode of the MIM capacitor 22.

Therefore, in order to obtain a favorable high-frequency characteristic, by connecting the bonding wires 40, 42 to the MIM capacitor with which an optimum capacitance value is given to a specific operation frequency, impedance matching can be achieved for plural types of different operation frequencies. That is, the matching chip 16 can correspond to wider operation frequencies.

Further, since the matching chip 16 is a lumped constant circuit, the circuit can be downsized in comparison to a case where the matching chip is a distributed constant circuit such as a microstrip line. Therefore, a large number of MIM capacitors functioning as variable frequency patterns can be arranged, so that the matching chip 16 can be used for different types of amplifiers having different operation frequencies.

When the capacitors included in the capacitor group 24 are all MIM capacitors, the lower electrodes 18a, 20a, 22a can be formed in one process, the dielectrics 18b, 20b, 22b can be formed in one process, and the upper electrodes 18c, 20c, 22c can be formed in one process. Since the dielectrics 18b, 20b, 22b are formed in one process, all the thicknesses of the dielectrics 18b, 20b, 22b are easily made the same. Since all the thicknesses of the dielectrics 18b, 20b, 22b are made the same, only by changing the lengths, that is, the areas of the dielectrics 18b, 20b, 22b, the capacitance values of the MIM capacitors 18, 20, 22 can be changed.

In such a way, one of characteristics of the present invention is to enhance the versatility of the amplifier 10 by connecting the transistor chip 30 and the upper electrode of any one of the MIM capacitors of the capacitor group 24 by the bonding wire 42. Therefore, various modifications can be made within the scope not losing this characteristic.

For example, since the capacitor group 24 is only required to have the plurality of MIM capacitors having different capacitance values, the number of the MIM capacitors to be included in the capacitor group 24 is not particularly limited. In a case where the capacitor group 24 has three or more MIM capacitors, the capacitance values of all the MIM capacitors are preferably different from each other. However, the capacitance values of only two of the MIM capacitors in the capacitor group 24 may be different from each other. The matching chip 16 may be arranged not on the input side of the transistor chip 30 but on the output side. The substrate 17 of the matching chip 16 is not limited to GaAs but may be formed of a semiconductor of Si, GaN, or the like. A transistor other than the multi-cell transistor may be formed in the transistor chip 30. It should be noted that these modifications can be applied to amplifiers according to the following embodiments.

The amplifiers according to the following embodiments have many common points to the amplifier 10 according to Embodiment 1. Thus, different points from the amplifier 10 will be mainly described.

Embodiment 2

Figure 5:
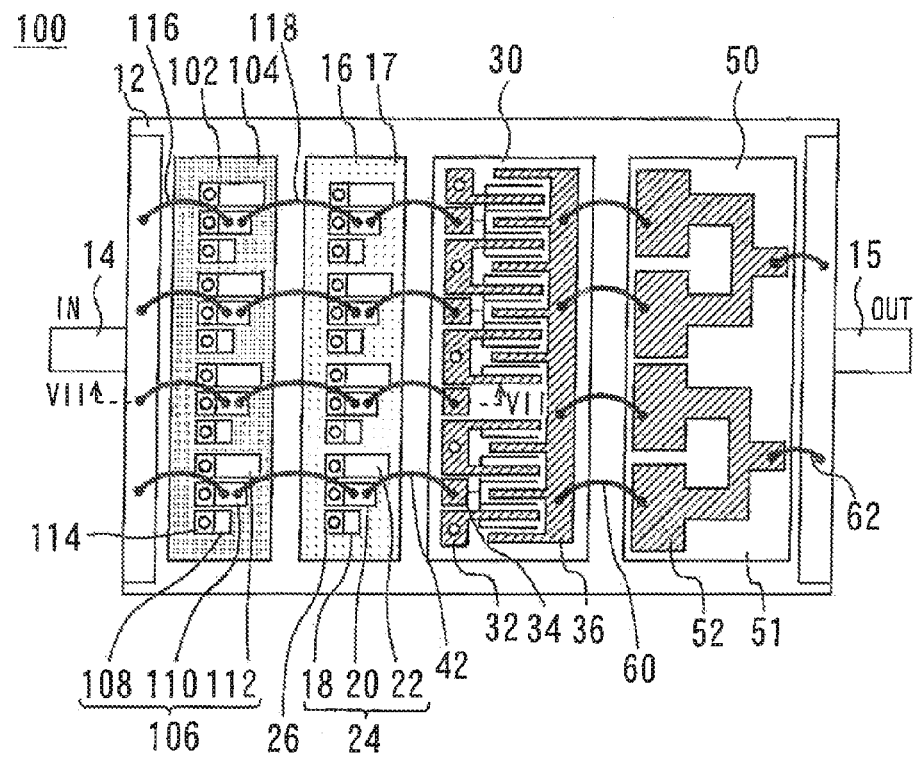
FIG. 5 is a plan view of an amplifier according to Embodiment 2 of the present invention.

FIG. 5 is a plan view of an amplifier 100 according to Embodiment 2 of the present invention. The amplifier 100 includes an additional matching chip 102. The additional matching chip 102 is arranged on the opposite side of the transistor chip 30 with respect to the matching chip 16. That is, the additional matching chip 102 is provided between the input feed-through unit 14 and the matching chip 16.

The additional matching chip 102 includes a substrate 104. The substrate 104 is formed of for example a compound semiconductor of GaAs or the like. The additional matching chip 102 includes additional capacitor groups 106 provided on the substrate 104. Each of the additional capacitor groups 106 includes additional MIM capacitors 108, 110, 112. Four additional capacitor groups 106 are formed on the substrate 104.

Figure 6:
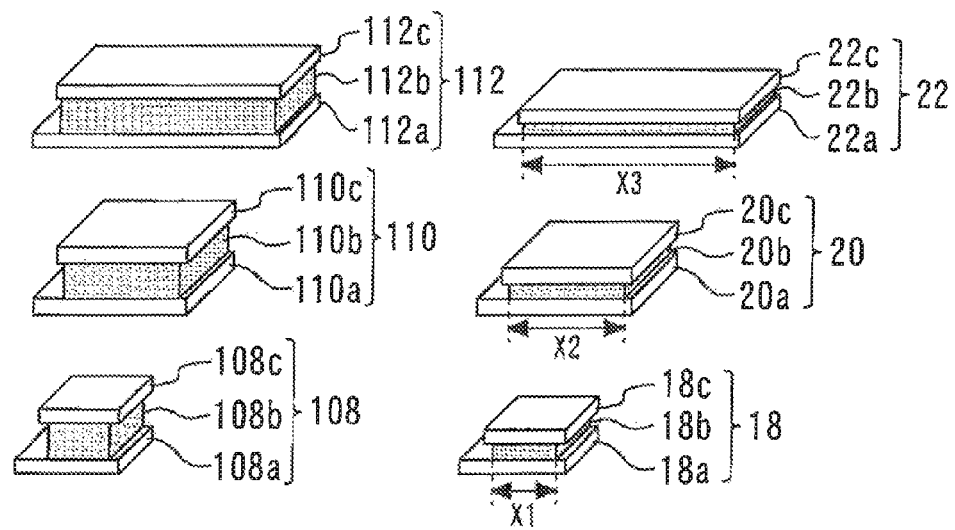
FIG. 6 is a perspective view of the additional MIM capacitors.

FIG. 6 is a perspective view of the additional MIM capacitors and the like. The additional MIM capacitors 108, 110, 112 respectively include additional lower electrodes 108a, 110a, 112a, additional dielectrics 108b, 110b, 112b, and additional upper electrodes 108c, 110c, 112c.

Thicknesses of the additional dielectrics 108*b*, 110*b*, 112*b* are uniform. That is, all the thicknesses of the additional dielectrics 108*b*, 110*b*, 112*b* are the same. The additional dielectrics 108*b*, 110*b*, 112*b* are formed to be thicker than the dielectrics 18*b*, 20*b*, 22*b*. Since lengths of the additional MIM capacitors 108, 110, 112 are different, capacitance values of the additional MIM capacitors 108, 110, 112 are not uniform. That is, the capacitance values of the additional MIM capacitors 108, 110, 112 are different from each other. It should be noted that the additional matching chip 102 has the same configuration as that of the matching chip 16 except the thicknesses of the dielectrics.

Returning to the description of FIG. 5, through electrodes 114 are formed in the substrate 104. The configuration of the through electrodes 114 is the same as the configuration of the through electrodes 26. Therefore, the additional lower electrodes of the additional MIM capacitors 108, 110, 112 are grounded. The input feed-through unit 14 and the upper electrode of the additional MIM capacitor 110 are connected by an additional bonding wire 116. The upper electrode connected to the bonding wire 42 (upper electrode of the MIM capacitor 20) and the additional upper electrode of the additional MIM capacitor 110 are connected by an additional bonding wire 118.

Figure 7:
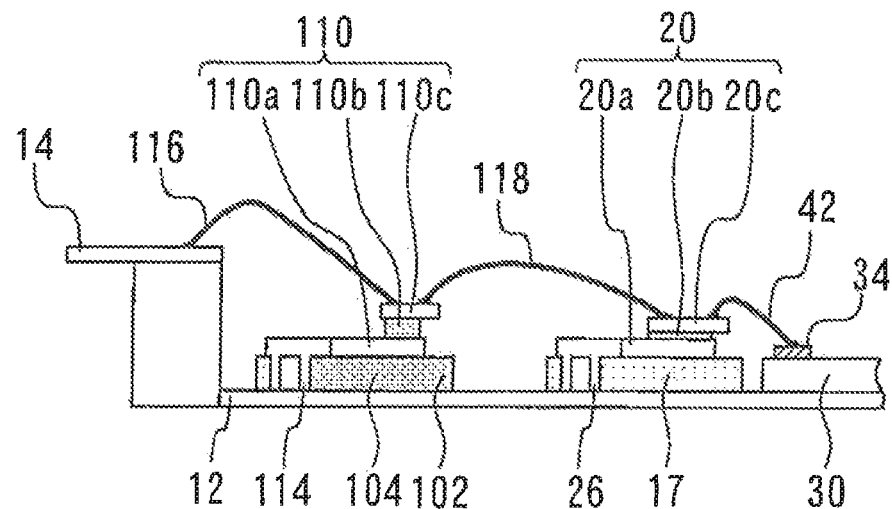
FIG. 7 is an arrow sectional view taken along a broken line VII-VII of FIG. 5.

FIG. 7 is an arrow sectional view taken along a broken line VII-VII of FIG. 5. The additional matching chip 102 is accommodated in the case 12. The additional MIM capacitor 110 and the MIM capacitor 20 are shunt-connected to the transmission line of the high-frequency signal inputted from the input feed-through unit 14.

The amplifier 100 according to Embodiment 2 of the present invention is to shunt-connect any one of the MIM capacitors 18, 20, 22 and any one of the additional MIM capacitors 108, 110, 112 to the transmission line of the high-frequency signal.

The capacitor to be shunt-connected can be easily changed by changing a place where the additional bonding wires 116, 118 and the bonding wire 42 are set. Therefore, the additional bonding wire 118 is not particularly limited as long as the additional bonding wire connects the upper electrode connected to the bonding wire 42 and the additional upper electrode of any one of the additional MIM capacitors of the additional capacitor group 106. For example, since the additional capacitor group 106 is only required to have the plurality of additional MIM capacitors having different capacitance values, the number of the additional MIM capacitors to be included in the additional capacitor group 106 is not particularly limited. In a case where the additional capacitor group 106 has three or more additional MIM capacitors, the capacitance values of all the additional MIM capacitors are preferably different from each other. However, the capacitance values of only two of the additional MIM capacitors in the additional capacitor group 106 may be different from each other. By adding the additional matching chip 102 to the amplifier 10 of Embodiment 1, choices of the capacitors to be shunt-connected are increased, so that impedance matching can be performed in wider frequency bands.

The matching chip 16 and the additional matching chip 102 may be formed of one chip. However, in that case, the MIM capacitors 18, 20, 22 and the additional MIM capacitors 108, 110, 112 are formed in the same process. Thus, the thicknesses of the dielectrics are unavoidably common. Therefore, in order to differentiate the capacitance values of the MIM capacitors 18, 20, 22 from the capacitance values of the additional MIM capacitors 108, 110, 112, there is a need for differentiating the areas of these capacitors from each other.

Thus, when the matching chip 16 and the additional matching chip 102 are separate substrates as in the amplifier 100, the matching chip 16 and the additional matching chip 102 can be formed in separate processes. In this case, not only the areas of the dielectrics but also the thicknesses can be differentiated from each other. Thus, a varying range of the capacitance values can be increased.

In the amplifier 100, since the thicknesses of the dielectrics 18*b*, 20*b*, 22*b* are different from the thicknesses of the additional dielectrics 108*b*, 110*b*, 112*b*, the capacitance of various values can be shunt-connected to the transmission line of the high-frequency signal. Various modifications can be made within the scope not losing this characteristic. For example, the dielectrics 18*b*, 20*b*, 22*b* may be formed to be thicker than the additional dielectrics 108*b*, 110*b*, 112*b*.

The amplifier 100 includes the two matching chips (the matching chip 16 and the additional matching chip 102) on the input side of the transistor chip 30. However, three or more matching chips may be provided on the input side of the transistor chip 30. Plural matching chips having the same configuration may be provided on the input side of the transistor chip 30. For example, two matching chips 16 may be provided on the input side of the transistor chip 30.

Embodiment 3

Figure 8:
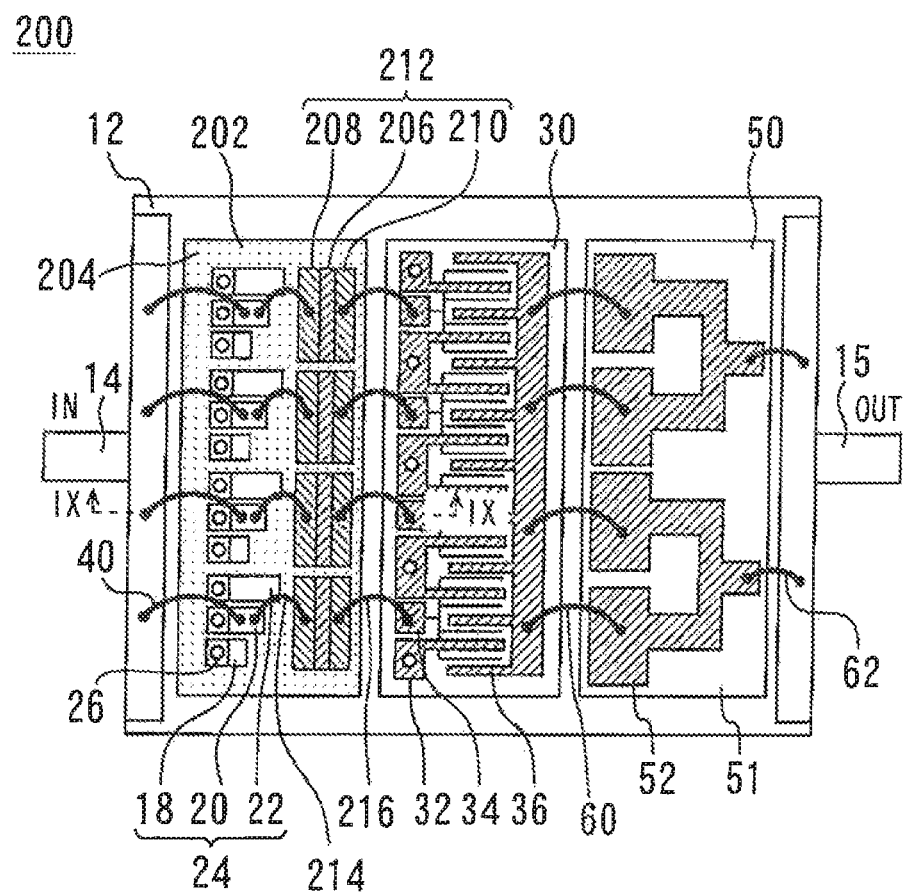
FIG. 8 is a plan view of an amplifier according to Embodiment 3 of the present invention.

FIG. 8 is a plan view of an amplifier 200 according to Embodiment 3 of the present invention. The amplifier 200 includes a matching chip 202. An ion-implanted resistor 206 is formed on a substrate 204 of the matching chip 202. A first electrode 208 is connected to one end of the ion-implanted resistor 206. A second electrode 210 is connected to the other end of the ion-implanted resistor 206. The ion-implanted resistor 206, the first electrode 208, and the second electrode 210 form a resistor unit 212. As many resistor units 212 as the cells of the multi-cell transistor are formed. Therefore, the number of the capacitor groups 24 is equal to the number of the resistor units 212, and the number is four in Embodiment 3.

Figure 9:
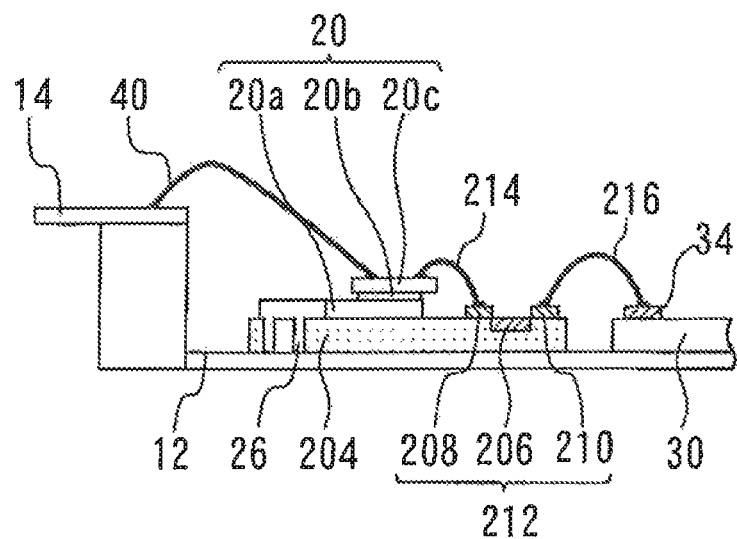
FIG. 9 is an arrow sectional view taken along a broken line IX-IX of FIG. 8.
Figure 10:
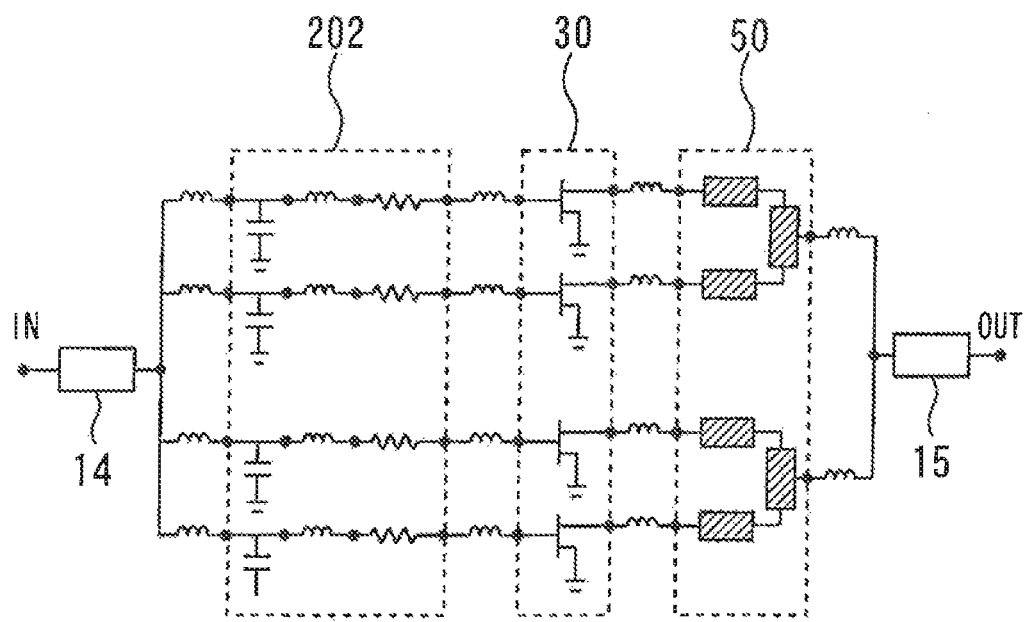
FIG. 10 is a circuit diagram of the amplifier of FIG. 8.

FIG. 9 is an arrow sectional view taken along a broken line IX-IX of FIG. 8. The upper electrode 20*c* and the first electrode 208 are connected by a first wire 214. The second electrode 210 and the transistor chip 30 (gate electrode 34) are connected by a second wire 216. In such a way, by inserting the resistor unit 212 between the MIM capacitor 20 and the transistor chip 30, unnecessary oscillation can be suppressed and the amplifier 200 can be stabilized. It should be noted that FIG. 10 is a circuit diagram of the amplifier 200 of FIG. 8.

The characteristics of the amplifiers according to the embodiments described above may be combined where appropriate.

According to the present invention, the MIM capacitor to be shunt-connected to a transmission line of a high-frequency signal is chosen from the plurality of MIM capacitors having different capacitance values. Thus, the versatility of the amplifier can be enhanced.

Obviously many modifications and variations of the present invention are possible in the light of the above teachings. It is therefore to be understood that within the scope of the appended claims the invention may be practiced otherwise than as specifically described.

What is claimed is:
1. An amplifier comprising:
a transistor chip;
a first matching chip with a first capacitor group having a plurality of first MIM capacitors, each of the first MIM capacitors including a first lower electrode, a first dielectric, and a first upper electrode;
a first bonding wire that electrically connects the transistor chip to the first upper electrode of any one of the first MIM capacitors of the first capacitor group and transmits a high-frequency signal; and
a case that accommodates the transistor chip and the first matching chip, wherein
the first lower electrodes of the plurality of first MIM capacitors are grounded, and
capacitance values of each of the first MIM capacitors of the first capacitor group are different from each other.

2. The amplifier according to claim 1, further comprising:
a second matching chip with a second capacitor group having a plurality of second MIM capacitors, each of the second MIM capacitors including a second lower electrode, a second dielectric, and a second upper electrode; and
a second bonding wire that electrically connects the second upper electrode to the second upper electrode of any one of the second MIM capacitors of the second capacitor group and transmits a high-frequency signal, wherein
the second matching chip is accommodated in the case, the second lower electrodes of the plurality of second MIM capacitors are grounded, and
capacitance values of each the second MIM capacitors of the second capacitor group are different from each other.

3. The amplifier according to claim 2, wherein thicknesses of the first dielectrics are different from thicknesses of the second dielectrics.

4. The amplifier according to claim 1, further comprising:
an ion-implanted resistor in the matching chip;
a first electrode connected to a first end of the ion-implanted resistor; and
a second electrode connected to a second end of the ion-implanted resistor, wherein the first bonding wire includes:
a first wire that electrically connects the first upper electrode to the first electrode, and
a second wire that electrically connects the second electrode to the transistor chip.

5. The amplifier according to claim 1, wherein
the transistor chip includes a multi-cell transistor, and
each of the cells of the multi-cell transistor includes a first capacitor group and a first bonding wire.

* * * * *